United States Patent
Huang

(10) Patent No.: US 7,485,899 B2
(45) Date of Patent: Feb. 3, 2009

(54) SEMICONDUCTOR PACKAGE HAVING AN OPTICAL DEVICE AND THE METHOD OF MAKING THE SAME

(75) Inventor: Cheng-Wei Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 142 days.

(21) Appl. No.: 11/540,605

(22) Filed: Oct. 2, 2006

(65) Prior Publication Data
US 2007/0090503 A1 Apr. 26, 2007

(30) Foreign Application Priority Data
Oct. 21, 2005 (TW) .............................. 94137009 A

(51) Int. Cl.
H01L 29/18 (2006.01)
H01L 29/22 (2006.01)
(52) U.S. Cl. ........................ 257/98; 257/88; 257/432; 257/433; 257/E25.032; 257/680
(58) Field of Classification Search ................ 257/88, 257/98, 432, 433, E25.032, 680
See application file for complete search history.

(56) References Cited

U.S. PATENT DOCUMENTS

| | | | | |
|---|---|---|---|---|
| 5,734,156 A | * | 3/1998 | Dahlin et al. | 250/216 |
| 6,566,745 B1 | * | 5/2003 | Beyne et al. | 257/680 |
| 6,621,616 B1 | * | 9/2003 | Bauer et al. | 359/273 |
| 2004/0038442 A1 | * | 2/2004 | Kinsman | 438/64 |
| 2005/0087757 A1 | * | 4/2005 | Erchak et al. | 257/98 |
| 2005/0161756 A1 | * | 7/2005 | Sun et al. | 257/433 |
| 2005/0236684 A1 | * | 10/2005 | Chen et al. | 257/433 |

* cited by examiner

*Primary Examiner*—Nitin Parekh
(74) *Attorney, Agent, or Firm*—Volentine & Whitt, P.L.L.C.

(57) ABSTRACT

A semiconductor package having an optical device and the method of making the same, includes a transparent substrate, a chip, an optical device and a carrier substrate. The transparent substrate has a plurality of first contacts and second contacts, wherein the first contacts are electrically connected to the second contacts. The chip is connected to the transparent substrate and forms a gap therebetween. The chip has a plurality of third contacts that are electrically connected to the first contacts. The optical device is disposed in the gap. The carrier substrate has a receiving space and a plurality of fourth contacts, wherein the receiving space accommodates the chip and the optical device, and the fourth contacts are electrically connected to the second contacts of the transparent substrate. Therefore, no connecting wires are needed and the step of wire bonding is omitted. Also, only one transparent substrate is used in the semiconductor package.

17 Claims, 9 Drawing Sheets

SEMICONDUCTOR PACKAGE HAVING AN OPTICAL DEVICE AND THE METHOD OF MAKING THE SAME

BACKGROUND OF THE INVENTION

1. Field of the Invention

The invention relates to a semiconductor package and the method of making the same, particularly to a semiconductor package having an optical device and the method of making the same.

2. Description of the Related Art

FIG. 1 shows a conventional semiconductor package having an optical device. The conventional semiconductor package 1 comprises a substrate 11, a CMOS chip 12, an optical device 13, a spacer 14, a plurality of wires 15, a carrier substrate 16, a circumfluent wall 17 and a glass substrate 18.

The substrate 11 has a die pad 111 and a plurality of substrate-contacts 112, wherein the die pad 111 and the substrate-contacts 112 are both on a top surface 113 of the substrate 11. The substrate-contacts 112 are formed around the die pad 111. The CMOS chip 12 has an active surface 121 and a back surface 122, wherein the active surface 121 has a plurality of chip-contacts 123, and the back surface 122 is adhered to the die pad 111 of the substrate 11 by an adhesive layer 10. The chip-contacts 123 are electrically connected to the substrate-contacts 112 by the wires 15.

The carrier substrate 16 has a bottom surface 161, and the optical device 13 is disposed on the bottom surface 161. The carrier substrate 16 is usually a transparent material. The spacer 14 is disposed between the active surface 121 of the CMOS chip 12 and the bottom surface 161 of the carrier substrate 16. The spacer 14 is ring-shaped and defines a first receiving space 141 for accommodating the optical device 13.

The circumfluent wall 17 is adhered to the top surface 113 of the substrate 11, and the circumfluent wall 17 and the top surface 113 of the substrate 11 define a second receiving space 171 for accommodating the CMOS chip 12, the optical device 13, the spacer 14, the wires 15 and the carrier substrate 16. The glass substrate 18 covers the circumfluent wall 17 so as to seal the second receiving space 171.

FIG. 2 shows the optical device 13 in FIG. 1. The optical device 13 is a Micro-Electro-Mechanical System and comprises at least one micro lens group 19. Each micro lens group 19 comprises a supporting element 20, a hinge 21 and a micro lens 22. The supporting element 20 has a first end 201 and a second end 202, wherein the second end 202 of the supporting element 20 is disposed on the bottom surface 161 of the carrier substrate 16. The hinge 21 is disposed at the first end 201 of the supporting element 20. One end of the micro lens 22 connects onto the hinge 21. The bottom of each micro lens group 19 exactly corresponds to a memory unit (not shown) of the CMOS chip 12. The micro lens 22 of the micro lens group 19 can be controlled by controlling the logic layers of the corresponding memory units so as to revolve around the hinge 21.

The conventional semiconductor package 1 has the following defects. For the conventional semiconductor package 1, the wires 15 are used to electrically connect the chip-contacts 123 to the substrate-contacts 112. Therefore, a wire bonding process is required. In addition, the conventional semiconductor package 1 needs two transparent substrates (i.e. the carrier substrate 16 and the glass substrate 18), so that the packaging process will be more complicated, and the production cost will increase.

Consequently, there is an existing need for providing a semiconductor package having an optical device and the method of making the same to solve the above-mentioned problems.

SUMMARY OF THE INVENTION

One objective of the present invention is to provide a semiconductor package having an optical device. The semiconductor package comprises: a transparent substrate, a chip, an optical device and a carrier substrate. The transparent substrate has a plurality of first contacts and a plurality of second contacts, wherein the first contacts are electrically connected to the second contacts. The chip is connected to the transparent substrate and forms a gap therebetween. The chip has a plurality of third contacts that are electrically connected to the first contacts. The optical device is disposed in the gap. The carrier substrate has a receiving space and a plurality of fourth contacts, wherein the receiving space is for accommodating the chip and the optical device, and the fourth contacts are electrically connected to the second contacts of the transparent substrate. Therefore, no connecting wires are needed and the step of wire bonding is omitted. Also, only one transparent substrate is used in the semiconductor package of the present invention.

Another objective of the present invention is to provide a packaging method for a semiconductor package having an optical device. The packaging method comprises the following steps of:

(a) providing a first substrate, having a plurality of transparent substrate units, each transparent substrate unit having a plurality of first contacts and a plurality of second contacts, wherein the first contacts electrically connecting to the second contacts;

(b) providing a second substrate, having a plurality of chip units, each chip unit having an optical device and a plurality of third contacts;

(c) connecting the first substrate and the second substrate to electrically connect the third contacts and the first contacts, and the first substrate and the second substrate form a gap for accommodating the optical device;

(d) cutting the first substrate and the second substrate to form a plurality of unit bodies, each unit body having a transparent substrate unit and a chip unit;

(e) providing a carrier substrate, having a receiving space and a plurality of fourth contacts; and (f) connecting the carrier substrate and the unit body, the receiving space accommodating the unit body, the transparent substrate unit sealing the receiving space, and the fourth contacts of the carrier substrate electrically connecting to the second contacts of the transparent substrate unit.

DETAILED DESCRIPTION OF THE INVENTION

Figure 1:
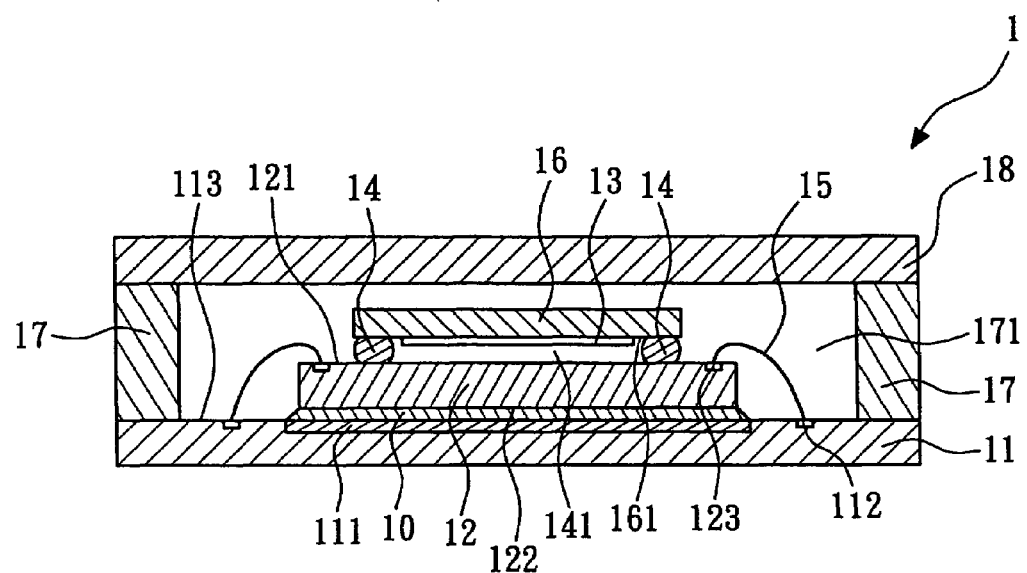
FIG. 1 shows a conventional semiconductor package having an optical device.
Figure 2:
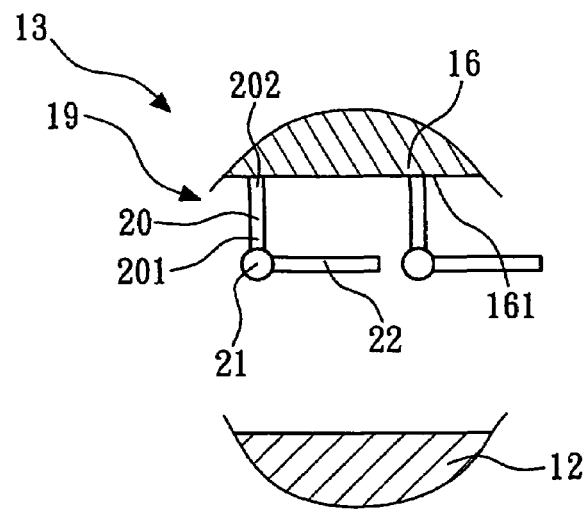
FIG. 2 shows the optical device in FIG. 1.
Figure 3:
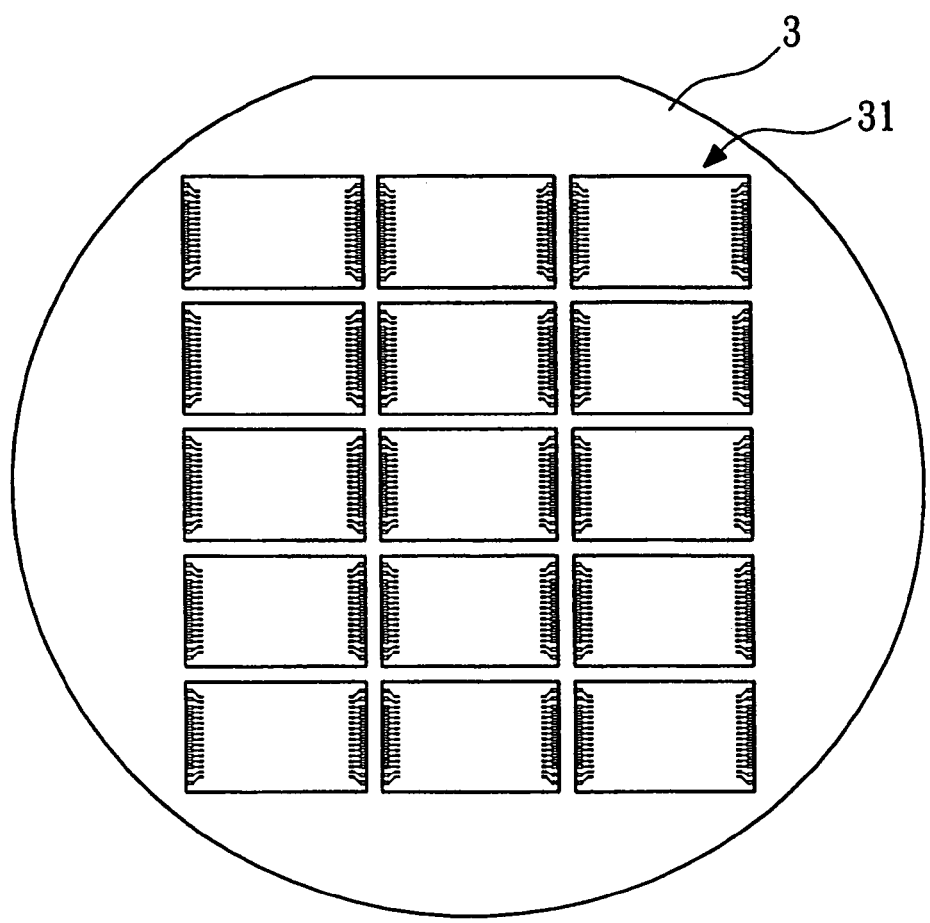
FIGS. 3 to 14 show a method for packaging a semiconductor package having an optical device according to the present invention.
Figure 4:
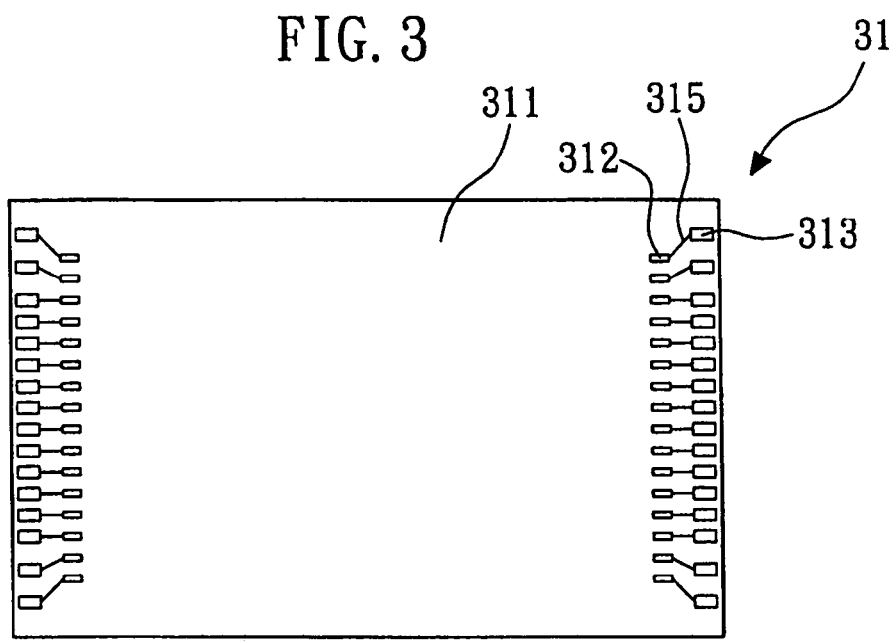

FIGS. 3 to 14 show a method for packaging a semiconductor package having an optical device according to the present invention. Firstly, referring to FIG. 3, a first substrate 3 (for example a glass wafer) is provided. The first substrate 3 has a plurality of transparent substrate units 31. FIG. 4 shows single transparent substrate unit 31 in FIG. 3. The substrate unit 31 has a first surface 314 (FIG. 8), a second surface 311, a plurality of first contacts 312, a plurality of second contacts 313 and a plurality of wires 315, wherein the first surface 314 is opposite to the second surface 311, and the first contacts 312 and the second contacts 313 are formed on the second surface 311 of the first transparent substrate unit 31. The second contacts 313 are disposed outside the first contacts 312, and the first contacts 312 and the second contacts 313 are electrically connected by the wires 315.

Figure 5:
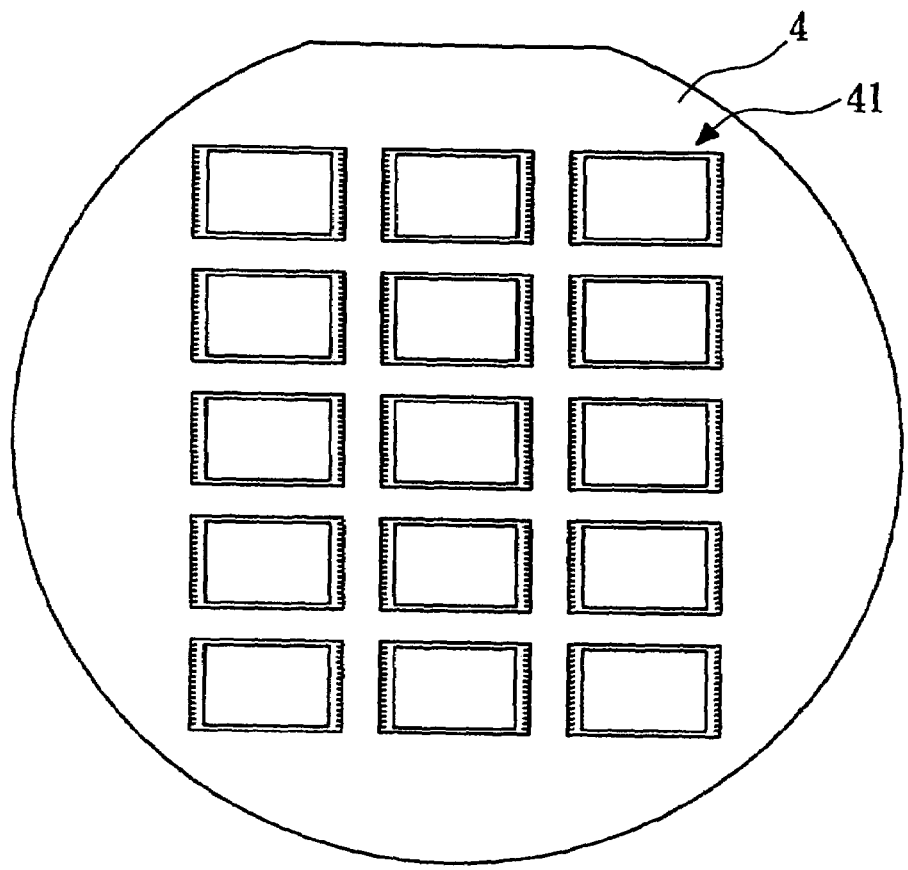
Figure 6:
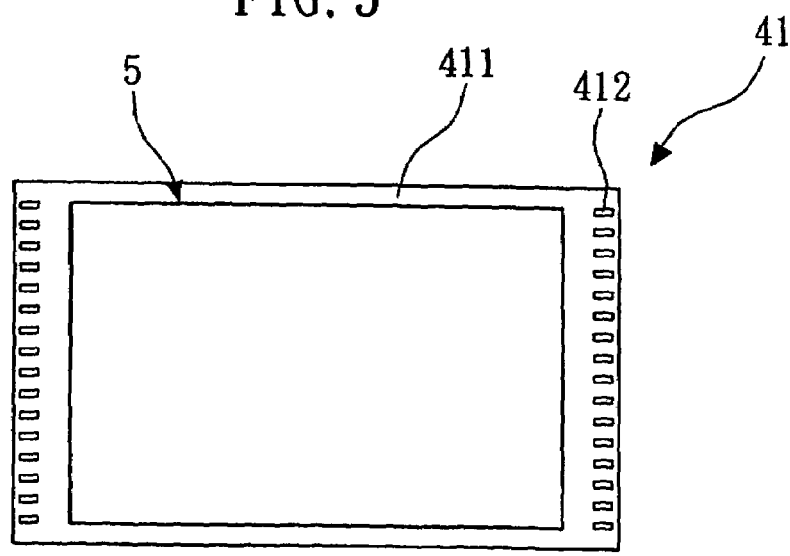

Referring to FIG. 5, a second substrate 4 (for example a CMOS wafer) is provided. The second substrate 4 has a plurality of chip units 41. FIG. 6 shows a single chip unit 41 from FIG. 5. The chip unit 41 has a first surface 411, a second surface 414 (FIG. 8), an optical device 5, a plurality of third contacts 412 and a plurality of memory units 413 (FIG. 7), wherein the first surface 411 is opposite to the second surface 414, and the third contacts 412 are disposed on the first surface 411 of the chip unit 41 and correspond to the first contacts 312 (FIG. 4).

Figure 7:
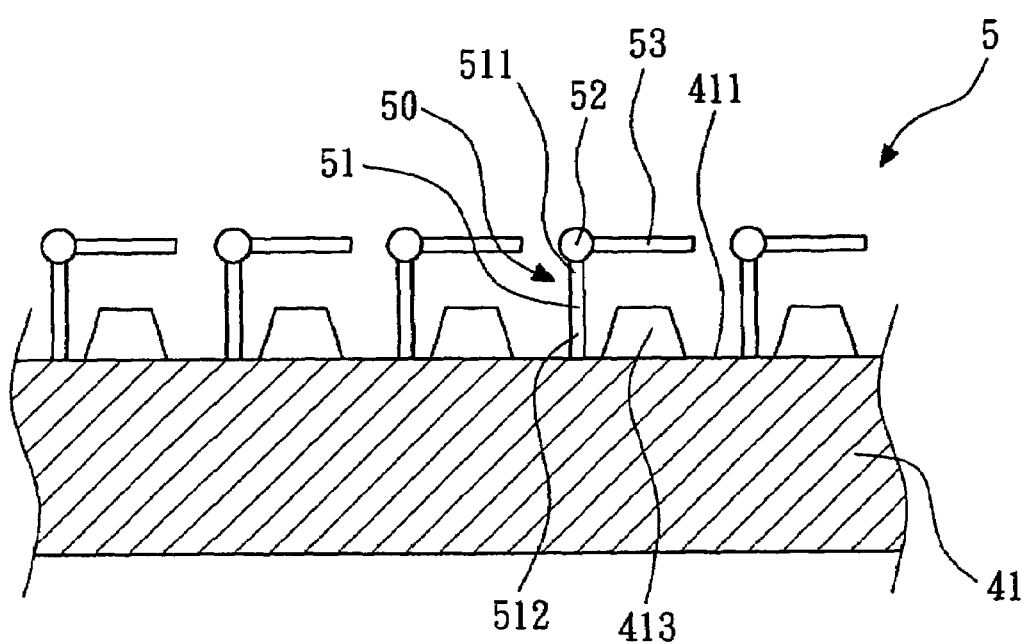

FIG. 7 shows the optical device 5 in FIG. 6. The optical device 5 is a Micro-Electro-Mechanical System and comprises at least one micro lens group 50. Each micro lens group 50 comprises a supporting element 51, a hinge 52 and a micro lens 53. The supporting element 51 has a first end 511 and a second end 512, wherein the second end 512 of the supporting element 51 is disposed on the first surface 411 of the chip unit 41. The hinge 52 is disposed at the first end 511 of the supporting element 51. One end of the micro lens 53 connects onto the hinge 52. The bottom of each micro lens group 50 exactly corresponds to the memory units 413 of the second substrate 4. The micro lens 53 of the micro lens group 50 can be controlled by controlling the logic layers of the corresponding memory units 413 so as to revolve around the hinge 52.

In the embodiment, the optical device 5 is the micro lens group 50; however, the type of the optical device 5 is not limited to the micro lens group 50. In addition, in the embodiment, the optical device 5 is disposed on the chip unit 41; however, the optical device 5 may also be disposed on the first transparent substrate unit 31.

Figure 8:
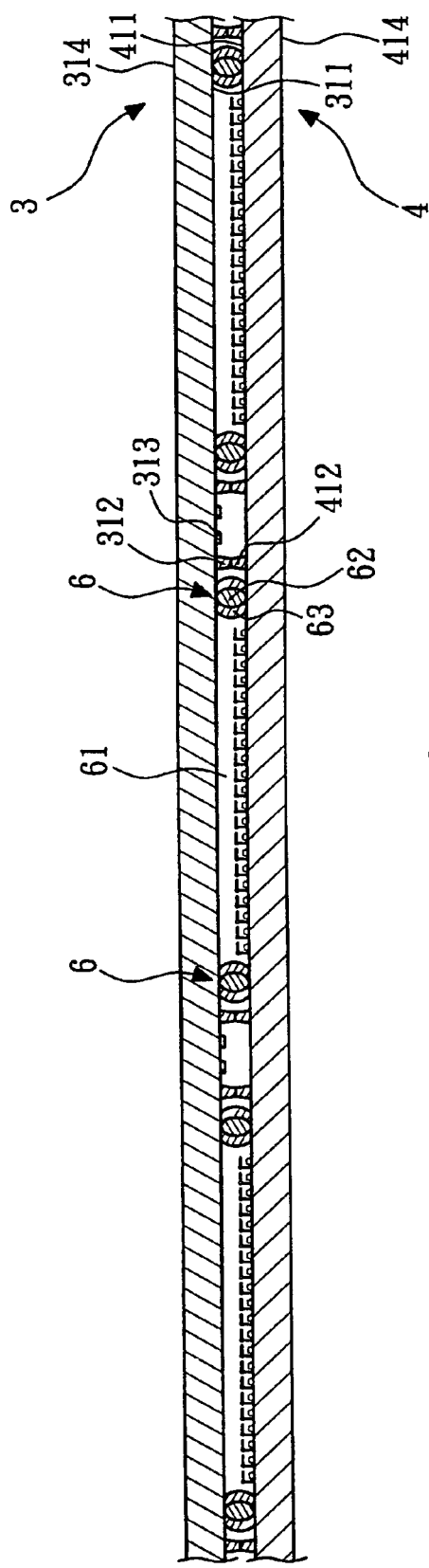
Figure 9:
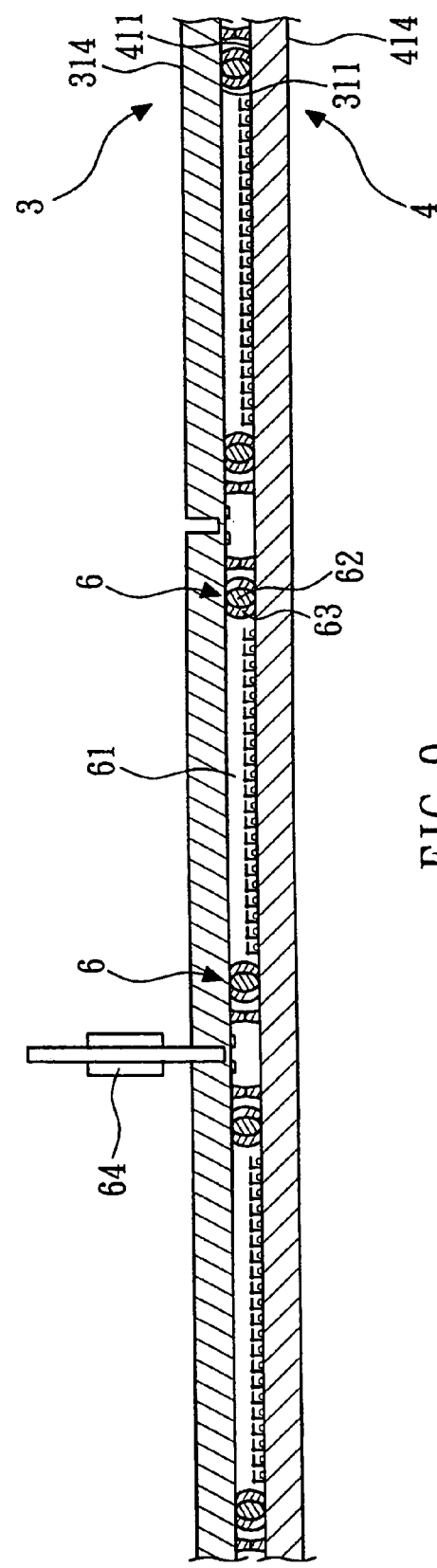

Referring to FIG. 8, a first connecting element 6 is used for connecting the first substrate 3 and the second substrate 4, and the third contacts 412 are electrically and physically connected to the first contacts 312. The first substrate 3 and the second substrate 4 form a gap 61 for accommodating the optical device 5. In the embodiment, the first connecting element 6 comprises a spacer 62 and an adhesive material 63, wherein the spacer 62 is used to maintain the gap 61, and the adhesive material 63 is used to encapsulate the spacer for connecting the first substrate 3 and the second substrate 4.

Figure 10:
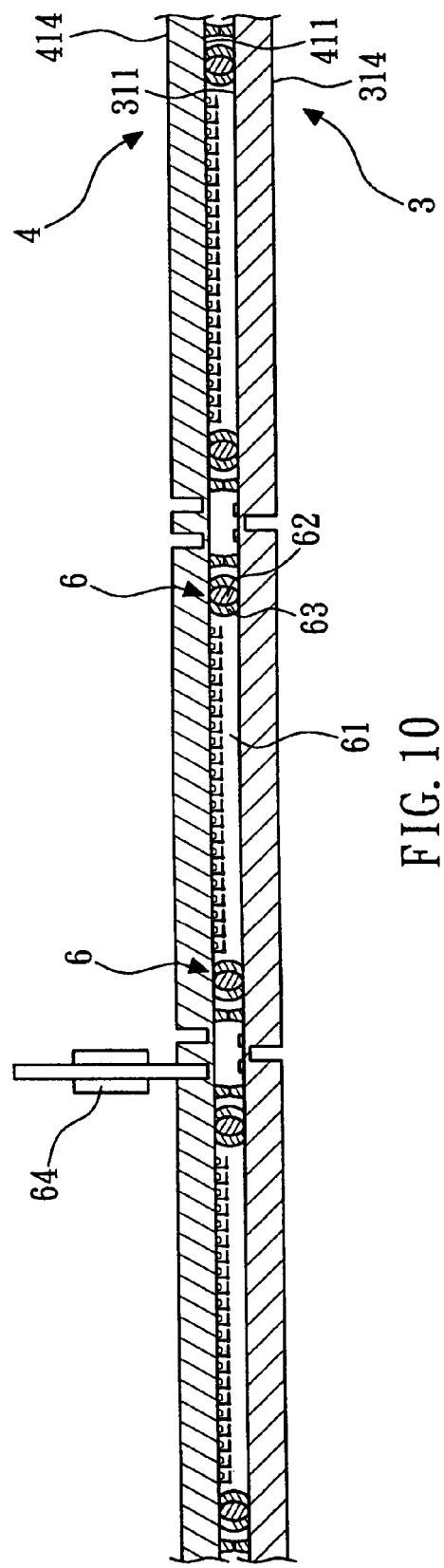

The first substrate 3 and the second substrate 4 are then cut to form a plurality of unit bodies. The cutting method of the embodiment is described as follows. Firstly, referring to FIG. 9, the first substrate 3 is cut by a cutting tool 64 accordingly along the edge of the first transparent substrate unit 31 on the first surface 314 of the first substrate 3. It should be noted that the cutting tool 64 just forms cavities on the first substrate 3 but does not cut the first substrate 3 off. Referring to FIG. 10, the first substrate 3 and the second substrate 4 are turned upside down, and then the second substrate 4 is cut by the cutting tool 64 along the edge of the chip unit 41 on the second surface 414 of the second substrate 4. It should be noted that the cutting tool 64 just forms cavities on the second substrate 4 but not cuts the second substrate 4 off.

Figure 11:
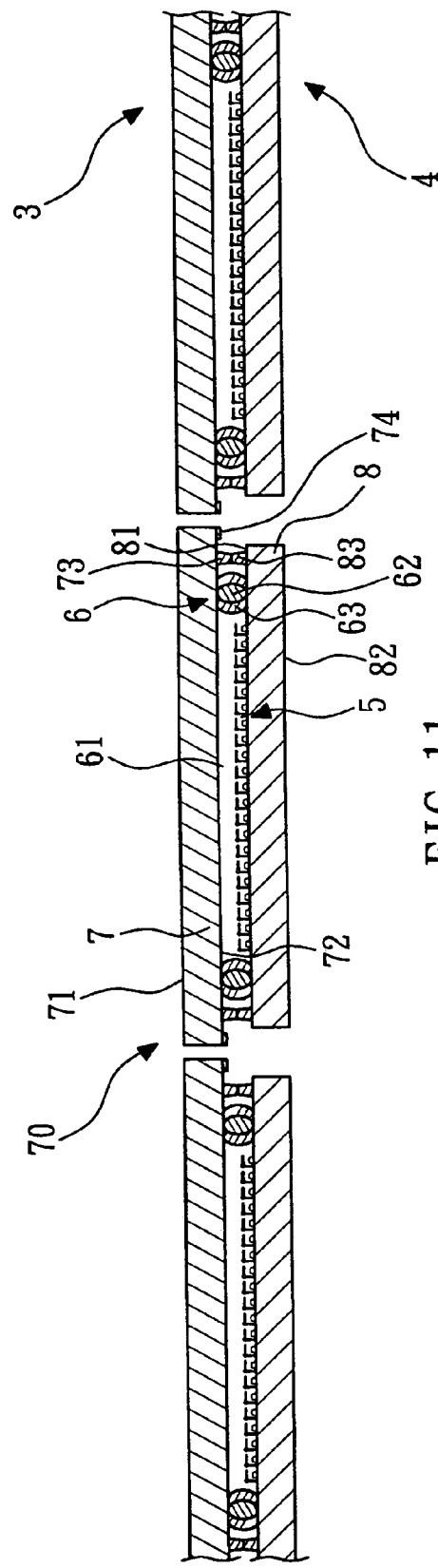

Referring to FIG. 11, the first substrate 3 and the second substrate 4 are broken off to form a plurality of unit bodies 70. Each unit body 70 comprises a transparent substrate 7, a chip 8, an optical device 5 and a first connecting element 6. The transparent substrate 7 is the transparent substrate unit 31 of the first substrate 3. The transparent substrate 7 comprises a first surface 71, a second surface 72, a plurality of first contacts 73 and a plurality of second contacts 74, wherein the first surface 71 is opposite to the second surface 72, and the first contacts 73 and the second contacts 74 are formed on the second surface 72 of the transparent substrate 7. The second contacts 74 are disposed outside the first contacts 73, and the first contacts 73 and the second contacts 74 are electrically connected by a plurality of wires (not shown).

The chip 8 is the chip unit 41 of the second substrate 4. The area of the chip 8 is smaller than that of the transparent substrate 7. The chip 8 comprises a first surface 81, a second surface 82, the optical device 5, a plurality of third contacts 83 and a plurality of memory units (FIG. 14), wherein the first surface 81 is opposite to the second surface 82, and the third contacts 83 are disposed on the first surface 81 of the chip 8.

The first connecting element 6 is used for connecting the transparent substrate 7 and the chip 8 so as to electrically and physically connect the third contacts 83 and the first contacts 73. The transparent substrate 7 and the chip 8 form a gap 61 to accommodate the optical device 5.

Figure 12:
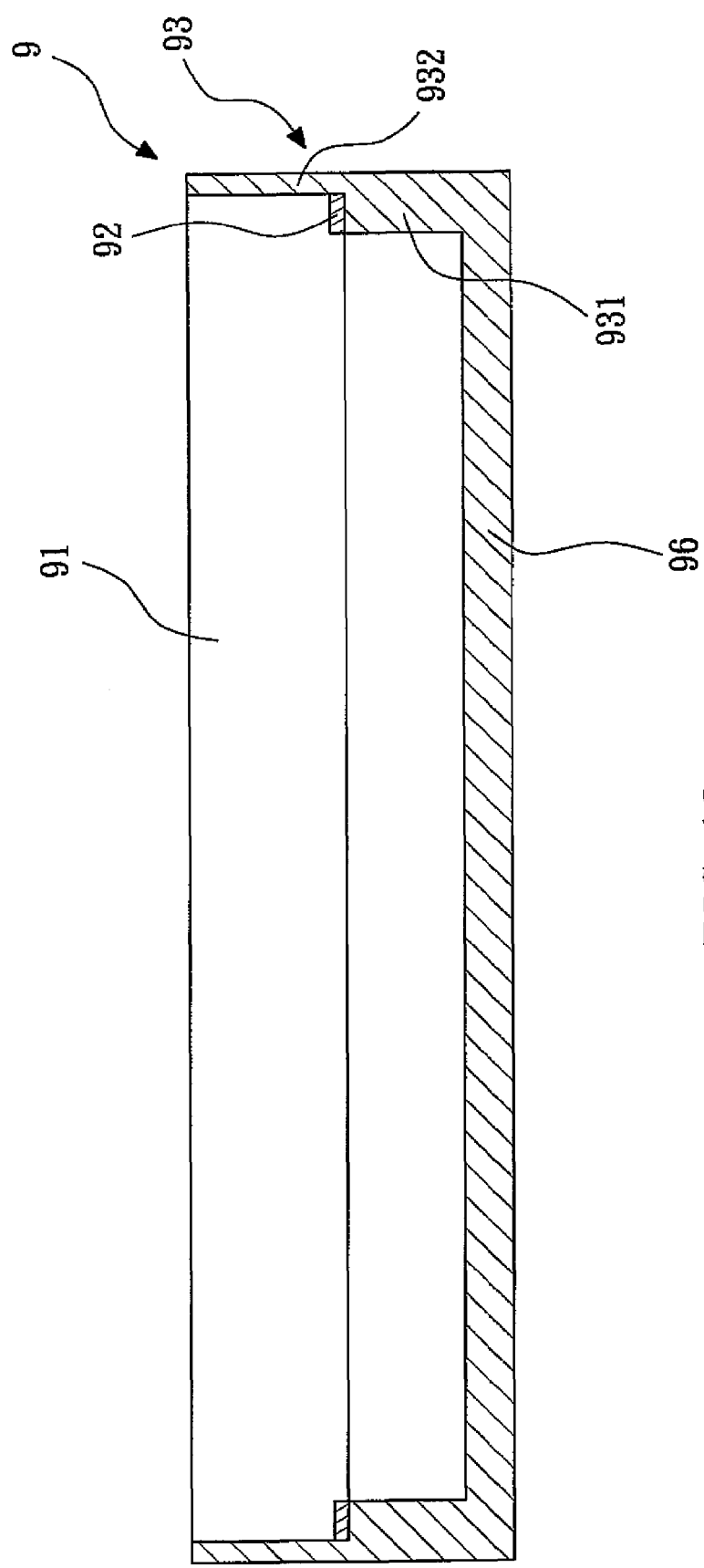

Referring to FIG. 12, a carrier substrate 9 is provided. The carrier substrate 9 has a receiving space 91 and a plurality of fourth contacts 92. In the embodiment, the carrier substrate 9 is ceramic. The carrier substrate 9 comprises a base 96 and a circumfluent wail 93. The circumfluent wall 93 is connected to the periphery of base 96 to define the receiving space 91, and the circumfluent wall 93 has an inner portion 931 and an outer portion 932. The outer portion 932 is higher than the inner portion 931 to form a ladder-shaped structure, and the fourth contacts 92 are disposed on the top of the inner portion 931.

Figure 13:
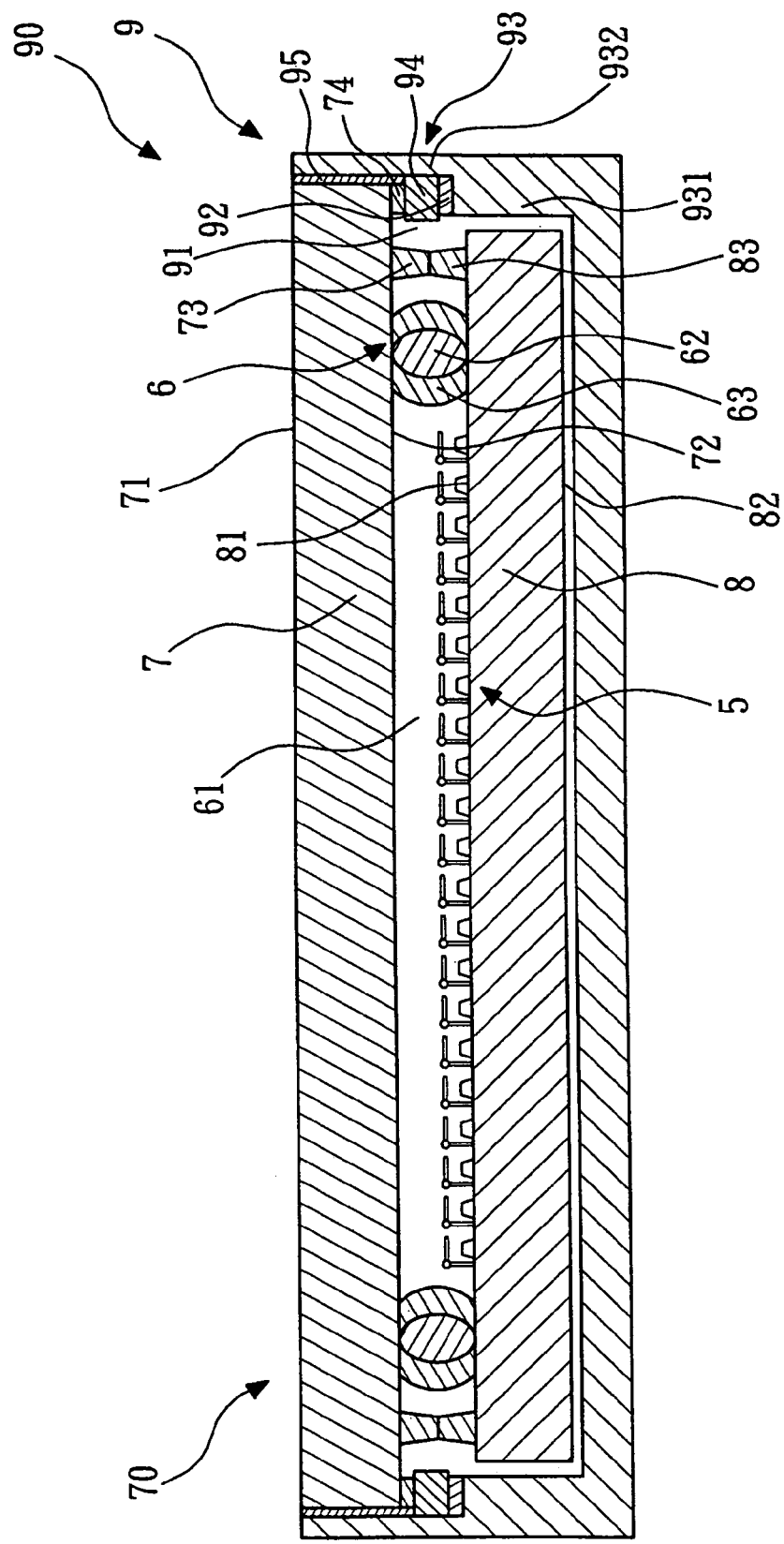

Referring to FIG. 13, the carrier substrate 9 and the unit bodies 70 are connected (including electrically and physically connected) by using a second connecting element 94 to form a semiconductor package 90. The receiving space 91 accommodates the unit body 70. The transparent substrate 7 seals the receiving space 91. The fourth contacts 92 of the carrier substrate 9 electrically connect to the second contacts 74 of the transparent substrate 7. In the embodiment, the second connecting element 94 is an anisotropic conductive film (ACF). In addition, for improving the effect of connection, a third connecting element 95 (for example an adhesive material) may be further used to connect the inner surface of the outer portion 932 and the edge portion of the transparent substrate 7.

Referring to FIG. 13 again, the sectional view of the packaging a semiconductor package having an optical device can be seen. The semiconductor package 90 comprises a transparent substrate 7, a chip 8, an optical device 5, a first connecting element 6, a carrier substrate 9, a second connecting element 94 and a third connecting element 95.

Preferably, the material of the transparent substrate 7 is glass. The transparent substrate 7 comprises a first surface 71, a second surface 72, a plurality of first contacts 73 and a plurality of second contacts 74, wherein the first surface 71 is opposite to the second surface 72, and the first contacts 73 and the second contacts 74 are formed on the second surface 72 of the transparent substrate 7. The second contacts 74 are disposed outside the first contacts 73, and the first contacts 73 and the second contacts 74 are electrically connected by a plurality of wires (not shown).

Preferably, the chip 8 is a CMOS wafer. The area of the chip 8 is smaller than that of the transparent substrate 7. The chip 8 comprises a first surface 81, a second surface 82, the optical device 5, a plurality of third contacts 83 and a plurality of memory units 84 (FIG. 14), wherein the first surface 81 is opposite to the second surface 82, and the third contacts 83 are disposed on the first surface 81 of the chip 8. The chip 8 is connected onto the substrate 7 by the first connecting element 6, and the transparent substrate 7 and the chip 8 form a gap 61 to accommodate the optical device 5. The third contacts 83 are electrically and physically connected to the first contacts 73.

Figure 14:
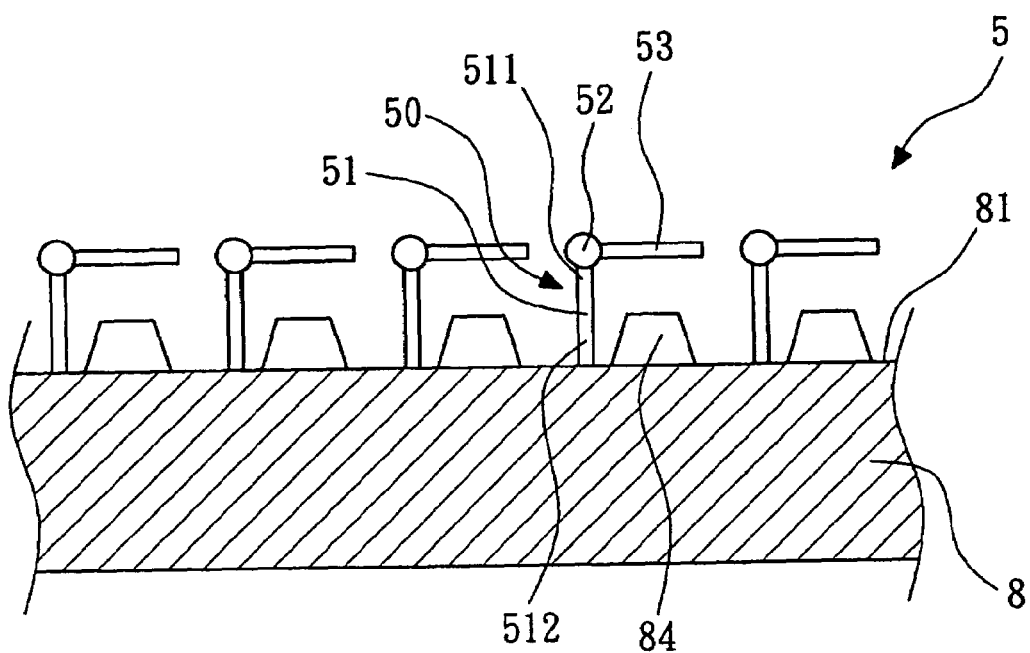

FIG. 14 shows the optical device 5 in FIG. 13. The optical device 5 is a Micro-Electro-Mechanical System and comprises at least one micro lens group 50. Each micro lens group 50 comprises a supporting element 51, a hinge 52 and a micro lens 53. The supporting element 51 has a first end 511 and a second end 512, wherein the second end 512 of the supporting element 51 is disposed on the first surface 81 of the chip 8. The hinge 52 is disposed at the first end 511 of the supporting element 51. One end of the micro lens 53 connects onto the hinge 52. The bottom of each micro lens group 50 exactly corresponds to the memory units 84 of the chip 8. The micro lens 53 of the micro lens group 50 can be controlled by controlling the logic layers of the corresponding memory units 84 so as to revolve around the hinge 52.

In the embodiment, the optical device 5 is the micro lens group 50; however, the type of the optical device 5 is not limited to the micro lens group 50. In addition, in the embodiment, the optical device 5 is disposed on the chip 8; however, the optical device 5 may also be disposed on the transparent substrate 7.

In the embodiment, the first connecting element 6 comprises a spacer 62 and an adhesive material 63, wherein the spacer 62 is used to maintain the gap 61, and the adhesive material 63 is used to encapsulate the spacer 62 for connecting the transparent substrate 7 and the chip 8.

The carrier substrate 9 has a receiving space 91 and a plurality of fourth contacts 92, wherein the receiving space 91 is used to accommodate the chip 8 and the optical device 5. In the embodiment, the carrier substrate 9 is ceramic. The carrier substrate 9 comprises a circumfluent wall 93 to define the receiving space 91, and the circumfluent wall 93 has an inner portion 931 and an outer portion 932. The outer portion 932 is higher than the inner portion 931 to form a ladder-shaped structure, and the fourth contacts 92 are disposed on the top of the inner portion 931.

The second connecting element 94 connects (both electrically and physically) the carrier substrate 9 and the second surface 72 of the transparent substrate 7. The transparent substrate 7 seals the receiving space 91. The fourth contacts 92 of the carrier substrate 9 electrically connect to the second contacts 74 of the transparent substrate 7. In the embodiment, the second connecting element 94 is an anisotropic conductive film. In addition, for improving the effect of connection, a third connecting element 95 (for example an adhesive material) may be further used to connect the inner surface of the outer portion 932 and the edge portion of the transparent substrate 7.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A semiconductor package having an optical device, comprising:
    a transparent substrate, having a plurality of first contacts and a plurality of second contacts, the first contacts electrically connecting to the second contacts;
    a chip, connecting to the transparent substrate and forming a gap therebetween, and having a plurality of third contacts for electrically connecting to the first contacts;
    an optical device, disposed in the gap; and
    a carrier substrate, having a base, a circumfluent wall, and a plurality of fourth contacts, the circumfluent wall connecting with a periphery of the base to define a receiving space for accommodating the chip and the optical device, and the fourth contacts disposed on the circumfluent wall for electrically connecting to the second contacts of the transparent substrate.

2. The semiconductor package according to claim 1, wherein the transparent substrate further comprises a first surface and a second surface, and the first contacts and the second contacts are formed on the second surface.

3. The semiconductor package according to claim 1, wherein the chip further comprises a first surface and a second surface, and the third contacts are formed on the first surface.

4. The semiconductor package according to claim 1, further comprising a first connecting element for connecting the chip and the transparent substrate to form the gap therebetween.

5. The semiconductor package according to claim 4, wherein the first connecting element comprises a spacer and an adhesive material, the spacer is used to form the gap between the chip and the transparent substrate, and the adhesive material is used to encapsulate the spacer so as to connect the chip and the transparent substrate.

6. The semiconductor package according to claim 1, wherein the optical device is disposed on the transparent substrate.

7. The semiconductor package according to claim 1, wherein the optical device is disposed on the chip.

8. The semiconductor package according to claim 1, wherein the optical device comprises at least one micro lens group, the micro lens group comprising:
    a supporting element, having a first end and a second end;
    a hinge, disposed at the first end of the supporting element; and
    a micro lens, having an end for connecting to the hinge so that the micro lens revolves around the hinge.

9. The semiconductor package according to claim 8, wherein the second end of the supporting element is disposed on the transparent substrate.

10. The semiconductor package according to claim 8, wherein the second end of the supporting element is disposed on the chip.

11. The semiconductor package according to claim 1, wherein the material of the transparent substrate is glass.

12. The semiconductor package according to claim 1, wherein the chip is a CMOS chip.

13. The semiconductor package according to claim 1, wherein the carrier substrate is ceramic.

14. The semiconductor package according to claim 1, wherein the circumfluent wall has an inner portion and an outer portion, the outer portion is higher than the inner portion to form a ladder-shaped structure, and the fourth contacts are disposed on the top of the inner portion.

15. The semiconductor package according to claim 14, further comprising a third connecting element for connecting the outer portion and the transparent substrate.

16. The semiconductor package according to claim 1, further comprising a second connecting element for electrically and physically connecting the second contacts and the fourth contacts.

17. The semiconductor package according to claim 16, wherein the second connecting element is an anisotropic conductive film (ACF).

* * * * *